_United States Patent_ [19]

Burnett et al.

[11] Patent Number: 5,137,618
[45] Date of Patent: Aug. 11, 1992

[54] METHODS FOR MANUFACTURE OF MULTILAYER CIRCUIT BOARDS

[75] Inventors: James M. Burnett, Maynard, Mass.; Richard J. Mathisen, Laytonville, Calif.

[73] Assignee: Foster Miller, Inc., Waltham, Mass.

[21] Appl. No.: 712,055

[22] Filed: Jun. 7, 1991

[51] Int. Cl.$^5$ ............................................. C25D 5/02
[52] U.S. Cl. .................................. 205/125; 205/135; 205/191; 205/210; 427/98; 430/312
[58] Field of Search ............... 204/15, 38.7; 427/98, 427/53.1; 430/312; 205/125, 191, 210, 291, 135

[56] References Cited

U.S. PATENT DOCUMENTS

| | | | |
|---|---|---|---|
| 4,388,351 | 6/1983 | Sawyer | 427/98 |
| 4,820,549 | 4/1989 | Ozaki et al. | 427/98 |
| 4,839,261 | 6/1989 | Nakazaki et al. | 430/313 |
| 4,902,610 | 2/1990 | Shipley | 430/312 |

Primary Examiner—John Niebling
Assistant Examiner—Kishor Mayekar
Attorney, Agent, or Firm—Iandiorio & Dingman

[57] ABSTRACT

The invention is for the formation of multilayer circuit boards where layers are formed sequentially using selective plating techniques and imaging of dielectric materials to achieve fine line resolution and interconnections between circuits. The invention permits the sequential formation of multilayers of higher density using imaging techniques. The method may also be used in single-sided and double-sided circuit board fabrication and for inner layers used in multilayer circuit boards.

31 Claims, 2 Drawing Sheets

METHODS FOR MANUFACTURE OF MULTILAYER CIRCUIT BOARDS

BACKGROUND OF THE INVENTION

1. Introduction

This invention relates to methods for the manufacture of circuit boards and to the boards produced thereby. More particularly, this invention relates to a method for making multilayer circuit boards by sequential formation of layers having signal layers separated from each other by interconnect layers.

2. Description of Related Art

Multilayer circuits enable formation of multiple circuits in minimal volume. They typically comprise a stack of layers with layers of signal lines (conductors) separated from each other by dielectric layers having plated holes known as "buried vias" providing electrical interconnections between the layers.

Current methods for fabricating multilayer boards are extensions of methods used for fabricating double-sided boards. A typical method comprises fabrication of separate innerlayers having circuit patterns disposed over their surface. A photosensitive material is coated over the copper surfaces of a copper clad innerlayer material, imaged, developed and etched to form a conductor pattern in the copper cladding protected by the photosensitive coating. After etching, the photosensitive coating is stripped from the copper leaving the circuit pattern on the surface of the base material. Following formation of the innerlayers, a multilayer stack is formed by preparing a lay up of innerlayers, ground plane layers, power plane layers, etc., typically separated from each other by a dielectric prepreg (a layer consisting of glass cloth impregnated with partially cured material, typically a B-stage epoxy resin). The outer layers of the stack comprise copper clad glass filled epoxy board material with the copper cladding comprising exterior surfaces of the stack. The stack is laminated to form a monolithic structure using heat and pressure to fully cure the B-stage resin.

Interconnections or through-holes, buried vias and blind hole interconnections are used to connect circuit layers within a multilayer board. The buried vias are plated through holes connecting two sides of an innerlayer. Blind vias typically pass through one surface of the stack and pass into and stop within the stack. Regardless of the form of interconnection, holes are generally drilled at appropriate locations through the stack, catalyzed by contact with a plating catalyst and metallized, typically with electroless copper overplated with electrolytic copper, to provide electrical contact between circuit innerlayers.

The uses, advantages and fabrication techniques for the manufacture of multilayer boards are described by Coombs, *Printed Circuits Handbook,* McGraw Hill Book Company, New York, 2nd edition, pp. 20-3 to 23-19, 1979, incorporated herein by reference.

Multilayer boards have become increasingly complex. For example, boards for main frame computers may have as many as 36 layers of circuitry, with the complete stack having a thickness of about ¼ inch. These boards are typically designed with 4 mil wide signal lines and 12 mil diameter vias for interconnections between signal line layers. For higher performance, higher speed, higher circuit density and higher surface impedance, it is desired to reduce signal lines to a width of 2 mils or less and vias to a diameter of 2 to 5 mils or less. In order to maintain characteristic impedance of 50 ohms and low levels of cross-talk, the thickness of the dielectric is normally less than 1 mil.

In addition to decreasing line width and via diameter, it is desired to avoid manufacturing problems associated with multilayer board fabrication. Current manufacturing methods utilize innerlayer materials comprising glass reinforced resin of about 4 to 5 mils in thickness clad with copper on both surfaces, glass/epoxy multilayer boards and ceramic co-fired boards. Since lamination is at a temperature above 150° C., the laminate shrinks during cooling to the extent permitted by the copper cladding. If the copper is etched to form a discontinuous pattern, laminate shrinkage may not be restrained by copper cladding. Consequently, further shrinkage may occur. This shrinkage may have an adverse effect on dimensional stability and layer registration.

The lamination procedure for formation of a multilayer stack includes a lay up of components prior to lamination. Care must be exercised to avoid shifting of innerlayers during lamination. Otherwise, the layers will not be aligned and electrical contact between layers will not be achieved. In addition, during lay up, air is often trapped in spaces adjacent to signal lines because a solid pre-preg is laid over the signal lines that does not fill recesses between signal lines. Care should be taken to evacuate entrapped air. Residual air pockets can cause defects and subsequent problems during use of the multilayer board.

SUMMARY OF THE INVENTION

To better understand the invention, the following definitions have been adopted:

"Permanent dielectric coating" means an organic dielectric coating composition preferably capable of imaging to yield a relief image. In accordance with the invention, the coating becomes an integral part of the multilayer board. The coating may be applied as a liquid coating composition and dried to a tack free coating or as a dry film. Preferably, the dielectric constant of the coating does not exceed 4.5. Imaging may be by laser ablation or by exposure to activating radiation and development in which latter case the dielectric coating is a protective dielectric coating.

"Imaged openings" means a relief image of (1) recesses or channels defining a pattern of conductors or (2) openings for interconnections, within a dielectric coating. Imaged openings are subsequently selectively metallized whereby they contain metal within the relief image.

The subject invention provides a simplified process for the manufacture of multilayer circuit boards avoiding difficulties described above. The process comprises sequential formation of layers where the multilayer structure has at least two circuit layers with conductive interconnections between circuit layers.

The multilayer circuit is formed over a temporary or permanent carrier, preferably an existing circuit or ground plane that becomes an integral part of the multilayer stack. If the carrier is a circuit or ground plane, the process may comprise formation of a dielectric coating over a circuit with imaged openings defining interconnections. The imaged openings may be obtained by exposure of a photoactive dielectric coating to activating radiation through a mask in an image pattern followed by development to form the imaged openings.

Alternatively, imaging may be by laser exposure (ablation) in which case the dielectric material need not be photoactive. Using the underlying copper exposed in the recesses defined by the imaged openings, copper is plated into the recesses to form metallized interconnections. The dielectric coating having the metallized interconnections is then coated with a sacrificial coating and similarly imaged to provide imaged openings in a conductor pattern defining a desired circuit. The sacrificial coating and the surfaces of the imaged openings in the sacrificial coating are then prepared for metal deposition, the sacrificial coating is replaced with a permanent dielectric coating having imaged openings corresponding to those originally defined in the sacrificial coating and metal is then selectively deposited within all imaged openings to render the same conductive. The walls of the imaged openings in the dielectric coating contains metal as it deposits during plating and assures a desired cross sectional shape of the deposit. The process is repeated sequentially to form sequential layers of circuits and interconnections.

The process of the invention is characterized by selective metallization of the relief image in the sacrificial coating utilizing an electroless plating catalyst and metal deposition from an electroless plating solution. A circuit is thereby formed without increase in the surface resistivity of an underlying substrate between conductor lines as a consequence of catalyst adsorption.

To obtain imaged openings in a dielectric or sacrificial coating, the coating may either be exposed to activating radiation in an image pattern and developed or laser imaged in a pattern to yield the relief image. The resolution of the imaged openings is dependent upon the imaging process and materials used. Photoactive dielectric and sacrificial coatings may be capable of development to yield high resolution relief images including openings that are smaller than the thickness of the coating. By use of such coatings, imaged openings for interconnections and conductors can be of a size equivalent to the resolution capability of the dielectric coating and the method of imaging and may be in any desired shape. Hence, conductors and interconnections can be reduced to 1 mil or less.

The process is also useful in single-sided and double-sided printed circuit board fabrication. When used in a single-sided or double-sided process, the process eliminates plating catalyst typically found between traces and therefore reduces the possibility of shorts developing between the circuits over time, and permits higher circuit densities.

DESCRIPTION OF THE PREFERRED EMBODIMENTS

A multilayer circuit, in accordance with the invention, is formed over a carrier which preferably becomes a part of the finished multilayer structure. The carrier may be permanent or temporary. A permanent carrier may comprise, for example, a conventional printed circuit board, a molded circuit, a hybrid circuit, a ground plane, etc. with additional layers added by the sequential process of the invention. A temporary carrier may comprise a conductive platen onto which multiple layers are sequentially applied after which the stack is separated from the platen. In this instance, at least the first layer of interconnections may be formed using electroforming with an imaged dielectric coating formed on the platen and metal electrolytically deposited onto exposed portions of the platen.

A detailed description of the process of the invention is set forth below.

Figure 1:
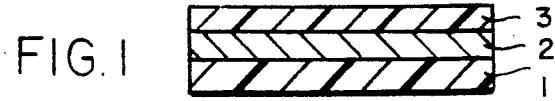
FIGS. 1 to 9 depict the cross section of a multilayer circuit formed over a ground plane layer during various stages of its fabrication.

In FIG. 1, there is shown a composite comprising substrate 1 and ground plane layer 2. The ground plane layer 2 is a metallic copper layer. A coating 3 of a permanent dielectric material is coated over ground plane layer 2. Preferably, the permanent dielectric material is light sensitive and possesses a dielectric constant adequate to insulate conductors from each other and from the ground plane. In this respect, a dielectric constant of not greater than 4.5 is preferred and a dielectric constant not exceeding 3.5 is more preferred. Numerous organic coating materials are suitable for this purpose. Preferred materials include resins such as epoxies, polyamines, polyimides, cyanate esters, benzocyclobutene, acetylene terminated biphenols, and liquid crystalline polymers, or mixtures thereof. In addition, the dielectric material may contain reinforcing agents such as glass, quartz, polyaramid and polyamide.

When a dielectric material that is photoactive is used, it should be capable of yielding images of satisfactory resolution. The necessary resolution is dependent upon the requirements of the multilayer board. Preferably, the resolution should be sufficient to provide line widths not exceeding 5 mils, preferably not exceeding 2 mils, and most preferably, not exceeding 1 mil, with line spaces at least 3 mils. Interconnections desirably do not exceed 5 mils and preferably are of a diameter less than the line width of the signal lines.

The selected dielectric coating material is desirably resistant to attack by an electroless plating solution over periods of prolonged exposure. Electroless copper plating solutions are usually strongly alkaline. Therefore, the dielectric should be resistant to attack by alkaline solutions. Exemplary materials suitable for this purpose are disclosed in U.S. Pat. Nos. 4,839,261; 4,830,953; and 4,820,549, all incorporated herein by reference. The dielectric coating composition is applied by any art recognized method.

Figure 2:
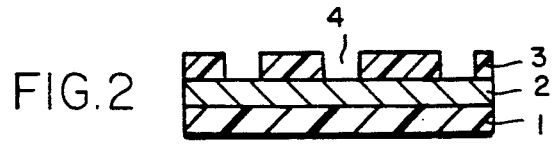

The next step in the process, shown in FIG. 2 of the drawings, comprises formation of imaged openings 4 in dielectric coating 3. Formation of the imaged openings 4 is by art recognized procedures such as by exposure to actinic radiation of suitable wavelength through a mask followed by development with a suitable developer or by laser ablation. Procedures for applying the permanent dielectric coating, drying the same if applied as a liquid coating composition, exposure and development can be found in the above referenced patents as well as in Scarlett, *The Multilayer Printed Circuit Board Handbook*, Electrochemical Publications Limited, Scotland, 1985, pp. 100 to 109, incorporated herein by reference. In FIG. 2, photodielectric coating 3 is shown with imaged openings in an array of recesses 4 for interconnections.

Figure 3:
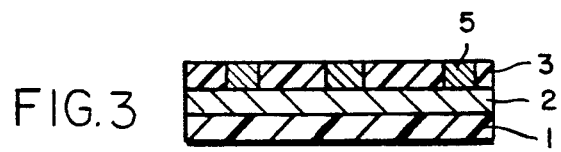

Following formation of photodielectric coating 3 having imaged openings 4, the imaged openings are plated with copper to form solid interconnections 5 as shown in FIG. 3. Plating may be by electrolytic or electroless. Electrolytic deposition is possible because ground plane 2 provides the necessary conductivity for an electroplating process. However, for high aspect interconnections, electroless plating is preferred as throwing power is inadequate in small diameter openings using electrolytic plating procedures.

Figure 4:
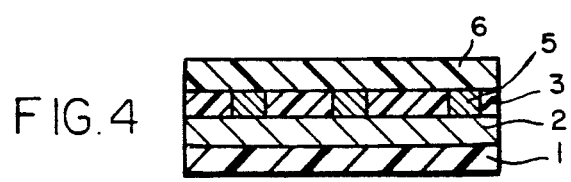

For electroless plating, the copper ground plane must be activated prior to electroless metal deposition. The reason for this is that copper is not generally autocatalytic to electroless deposition. Activation can be accomplished in several ways. For example, mild etching with an acid solution such as a hydrochloric acid solution may be used to activate the copper. Alternatively, activation may be accomplished by contact with a weak solution of a noble metal salt, preferably, a one percent solution of palladium chloride in hydrochloric acid. The plating solution is typically an electroless copper plating solution as is known to the art. Such solutions typically comprise a source of cupric ions, a complexing agent to hold the ions in solution, a reducing agent to reduce the cupric ions to metallic copper in the presence of the catalyst e.g., formaldehyde and a pH adjustor. Typical copper plating solutions are disclosed in U.S. Pat. Nos. 4,834,796; 4,814,009; 4,684,550; and 4,548,644, all incorporated herein by reference. A preferred plating solution is one capable of plating ductile copper able to withstand a solder shock test of about 260° C. for 10 seconds without cracking. Plating is continued until desired deposit thickness is achieved. The next step in the process is shown in FIG. 4 of the drawings and comprises formation of sacrificial coating 6 over that layer comprising dielectric coating 3 and interconnects 5. The sacrificial coating 6 is applied as a uniform coating over said surface. The sacrificial coating used is one that is not a permanent coating and therefore does not require the dielectric capability of the dielectric coating. The requirements of the sacrificial coating include image resolution to 25 microns, easy development and removal, and an ability to withstand catalysis chemicals and processes. More specifically, the materials useful as a sacrificial coating should have the properties of being developable in either weak base or solvent, resistant to mildly acidic solutions after development, and strippable by a solution that does not effect the catalyst. The stripper solution can be either a base or solvent. A preferred material is Laminar$^R$ UF dry film photopolymer manufactured by Dynachem Other dry film or liquid photopolymers that have the above listed properties may also be used.

Figure 5:
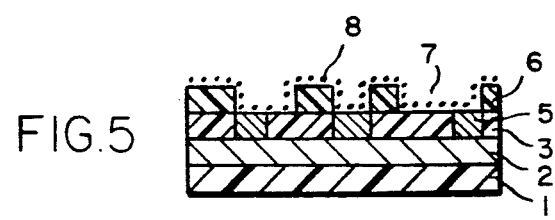

With reference to FIG. 5, following application of the sacrificial coating 6, it is imaged and developed to provide imaged openings 7 in a desired circuit or conductor pattern. Methods used to form the sacrificial coating, image the same and develop are analogous to those used for the photodielectric material. Following formation of imaged openings 7, the entire surface of the sacrificial coating is catalyzed with an electroless plating catalyst 8 to render the entire surface catalytic to electroless plating Known plating catalysts typically comprise tin-palladium colloids where the colloids adsorb from suspension onto the surface of a substrate as a thin layer of discrete particles. Such catalysts are disclosed in U.S. Pat. Nos. 3,011,920 and 4,762,560, incorporated herein by reference. Other catalysts known to the art may also be used such as those formed from copper. Catalysis occurs by immersing a substrate in the catalyst solution for a time sufficient for the catalyst to adsorb onto the surface. Typically, from one to ten minutes is adequate.

Figure 6:
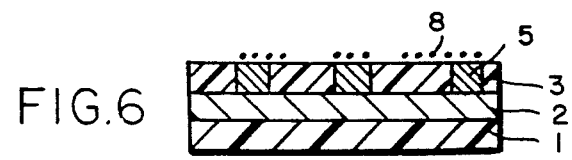

FIG. 6 of the drawings illustrates the next step in the process comprising removal of sacrificial coating 6 (FIG. 5). The sacrificial coating is removed by contact of the coating with a stripper capable of dissolving the coating without disrupting the catalyst adsorbed onto dielectric coating 3 and interconnects 5. A base or solvent solution for the particular sacrificial coating material would be within the knowledge of those skilled in the art. The removal of the sacrificial coating leaves plating catalyst 8 over the surface comprising dielectric coating 3 and interconnects 5 in a desired circuit pattern.

Figure 7:
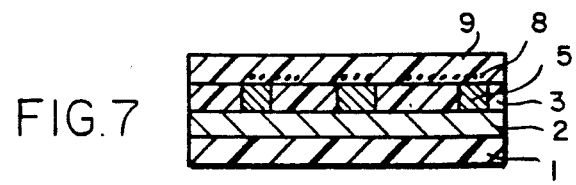
Figure 8:
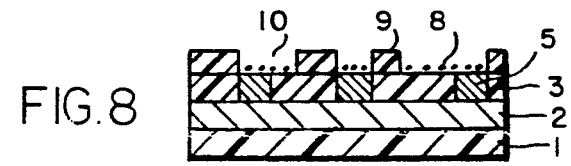

It is desirable that conductors of a circuit have a rectangular cross section with square corners. In accordance with the invention, this is achieved by providing a second coating with a relief pattern corresponding to the relief pattern originally formed in the sacrificial coating. The formation of the second coating is illustrated in FIGS. 7 and where in FIG. 7, the formation of a second coating 9 is displaced over the surface comprising dielectric coating 3 having interconnects 5 and remaining catalytic layer 8. When the second coating is a second permanent dielectric coating, the second coating 9 is desirably of the same material as coating 3. In an alternative embodiment, the second coating 9 may be a second sacrificial coating, with replacement by a superior dielectric in a subsequent step. Following formation of coating 9, it is imaged to form imaged openings 10 which correspond to the imaged openings originally formed in the sacrificial coating 6 (FIG. 5). Plating catalyst 8 is bared in the imaged openings in a desired circuit pattern, and areas between circuit lines are free of catalyst.

Figure 9:
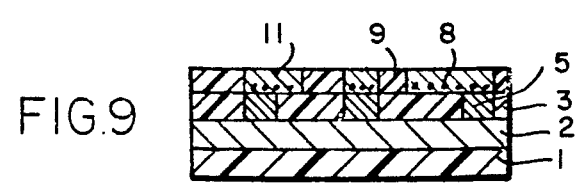

Following formation of the imaged openings 10 in dielectric coating 9, and with reference to FIG. 9 of the drawings, electroless copper 11 is plated into the imaged openings to form the conductors and completing the first circuit layer. Plating is from an electroless plating solution and is deposition is catalyzed by contact with exposed plating catalyst 8. Plating preferably continues until a planar surface is formed—i.e., to the full thickness of dielectric coating 9.

Following formation of the circuit as described above, the process can be repeated as often as desired.

It should be obvious to those skilled in the art that the procedures described above illustrate major steps in the process contemplated by the invention. Many of the procedural steps known in the art have been omitted. For example, it is known that when using organic coating materials, baking for drying and curing are recommended and are recognized procedures. Likewise, to adhere one organic coating to another, it is often necessary to pretreat the coating to enhance adhesion. In catalysis processes, it is conventional to treat the catalyst with an accelerator prior to plating. To prepare copper for subsequent deposition or for adhesion of an organic coating material to it, it is often necessary to clean and activate the copper. These are all steps known to the art and not described in detail herein.

In many of the above processes, photoimagable dielectric coatings are used to form imaged openings into which metal deposits, conductors and interconnections conform to the shape of the channel or opening. Hence, plated conductors and interconnections will have a cross section conforming to the shape of the imaged opening, typically square or rectangular for conductors and circular for interconnections. Moreover, imaged openings formed by exposure and development of photoactive dielectric materials may be of any desired shape or size. In this respect, the invention permits formation of interconnections that could not be achieved with prior art processes.

In accordance with the invention, openings for interconnections between layers are imaged - not drilled. Therefore, it is possible to form a multilayer board without drilling. In this respect, all vias can be formed by imaging and selective deposition or by laser imaging, though it may be desirable to drill holes from the exterior of the stack to its interior.

Though the invention has been described using the example set forth above, it should be understood that the invention is useful for many other methods used in the manufacture of circuit boards. For example, the selective catalysis technique may also be used for printed wiring board metallization with electroless copper involving both single-sided and double-sided board fabrication. In those cases, the selective catalysis and electroless plating process replaces the print and etch processes typically used in standard printed wiring board manufacture. Typical print and etch circuit line dimensions are normally 8 to 10 mil lines and spaces, and the limit of print and etch technology is around 4 mil lines and spaces with very low yield. The selective catalysis technique described herein is capable of resolving 1 mil or less lines and spaces, thus significantly increasing circuit board utilization resulting in a four fold decrease in the number of layers required for a multilayer board application. For example, a four layer board manufactured with print and etch technology will only require one layer using the selective catalysis and plating technology of the present invention.

Figure 10:
FIGS. 10 to 15 depict the selective catalysis process as it applies to circuit board metallization directly on a dielectric substrate.

A detailed description of such a process will now be described by reference to FIGS. 10 through 14. In FIG. 10, there is shown a dielectric substrate 3, preferably with a dielectric constant not exceeding 5.0. Numerous dielectric substrate materials are suitable for this purpose and preferred materials include resins such as epoxies, polyamines, polyimides, cyanate esters, benzocyclobutene, acetylene terminated biphenols, and liquid crystalline polymers, or mixtures thereof. In addition, the dielectric material may contain reinforcing agents such as glass, quartz, polyaramid and polyamide.

Figure 11:
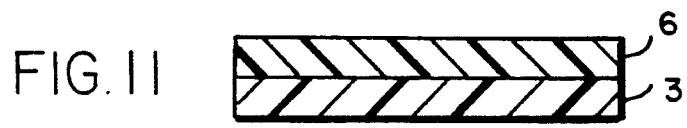

The first step in the process is shown in FIG. 11 of the drawings and comprises formation of sacrificial coating 6 over the dielectric substrate 3. The sacrificial coating 6 is applied as a uniform coating over said substrate. The sacrificial coating 6 used is one that is not a permanent coating and therefore does not require the dielectric capability of the dielectric coating. The requirements of the sacrificial coating include image resolution to 25 microns, easy development and removal, and an ability to withstand catalysis chemicals and processes. More specifically, the materials useful as a sacrificial coating should have the properties of being developable in either weak base or solvent, resistant to mildly acidic solutions after development, and strippable by a solution that does not effect the catalyst. The stripper solution can be either a base or solvent. A preferred material is Laminar$^R$ UF dry film photopolymer manufactured by Dynachem. Other dry film or liquid photopolymers that have the above listed properties may also be used.

Figure 12:
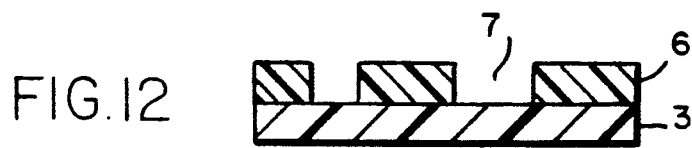
Figure 13:
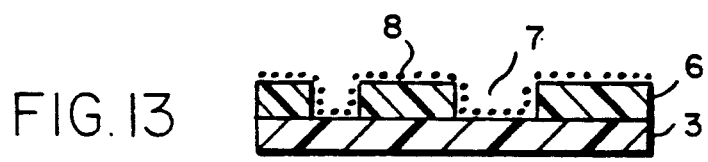

With reference to FIG. 12, following application of the sacrificial coating 6, it is imaged and developed to provide imaged openings 7 in a desired circuit or conductor pattern. Methods used to form the sacrificial coating, image the same and develop are analogous to those used for the photodielectric material. Following formation of imaged openings 7, the entire surface of the sacrificial coating is catalyzed with an electroless plating catalyst 8 to render the entire surface catalytic to electroless plating, as shown in FIG. 13. Known plating catalysts typically comprise tin-palladium colloids where the colloids adsorb from suspension onto the surface of a substrate as a thin layer of discrete particles. Such catalysts are disclosed in U.S. Pat. Nos. 3,011,920 and 4,762,560, incorporated herein by reference. Other catalysts known to the art may also be used such as those formed from copper. Catalysis occurs by immersing a substrate in the catalyst solution for a time sufficient for the catalyst to adsorb onto the surface. Typically, from one to ten minutes is adequate.

Figure 14:

FIG. 14 of the drawings illustrates the next step in the process comprising removal of sacrificial coating 6 (FIG. 13). The sacrificial coating is removed by contact of the coating with a stripper capable of dissolving the coating without disrupting the catalyst adsorbed onto dielectric substrate 3. A base or solvent solution for the particular sacrificial coating material would be within the knowledge of those skilled in the art. The removal of the sacrificial coating leaves plating catalyst 8 over the surface comprising dielectric substrate 3 in a desired circuit pattern.

Figure 15:
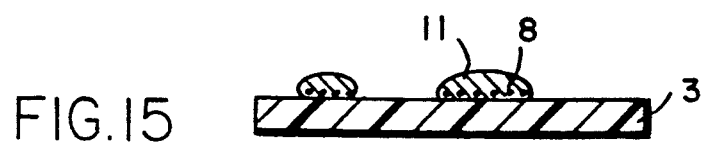

Following formation of the selectively plated catalyst in a desired circuit pattern on the dielectric substrate, electroless copper 11 is plated onto the catalyst to form the conductors, FIG. 15. Plating is from an electroless plating solution and its deposition is catalyzed by contact with exposed plating catalyst 8. Plating continues until the desired thickness of copper is reached, typically 5 to 10 microns. Circuit boards fabricated using the process of the present invention are characterized by circuit lines free of catalyst and plated metal, thus overcoming the failures of boards formed by typical print and etch techniques.

It should be understood that the selective catalyzing and plating process described herein can be applied to single, double and multilayer circuit boards In the case of single layer boards, the process is carried out on one side of a dielectric substrate and alignment is achieved through any of several imaging and alignment techniques known to those skilled in the art. Interconnects from one side of the dielectric substrate to the other are achieved by plated through holes. In the case of multilayer boards several selectively catalyzed and plated dielectric substrates are fabricated, aligned and laminated together to form a multilayer circuit board. Interconnections or through holes, buried vias and blind hole interconnections are used to connect circuit layers within the multilayer board.

We claim:

1. A process for the formation of a circuit board having two or more layers of circuitry, said process comprising the steps of applying a permanent dielectric coating over a substrate, said permanent dielectric coating having imaged openings defining interconnections, selectively plating metal into said imaged openings to form interconnections, applying a sacrificial coating over the layer comprising the permanent dielectric coating and metallized interconnections, said sacrificial coating having imaged openings defining a circuit pattern, catalyzing surfaces of underlying material where bared and the surfaces of said sacrificial coating with an electroless plating catalyst, replacing said sacrificial coating with a second coating having imaged openings corresponding to those formed in the sacrificial coating, and electrolessly plating metal into said openings for interconnections in said dielectric coating and onto catalyzed surfaces, whereby, when plated, there is formed a second circuit in electrical contact with said first substrate, and whereby areas between circuit lines are free of catalyst.

2. The process of claim 1 where the substrate is a circuit board.

3. The process of claim 1 where the substrate is a ground plane over a non conducting substrate.

4. The process of claim 3 where interconnections are formed by electrolytic deposition.

5. The process of claim 4 including a step of activating underlying copper prior to electrolytic metal deposition.

6. The process of claim 1 where interconnections are formed by electroless deposition.

7. The process of claim 1 where said sacrificial coating is applied as a dry film.

8. The process of claim 1 where said sacrificial coating is applied as a liquid coating composition.

9. The process of claim 1 where said sacrificial coating is chemically resistant to catalysis chemicals.

10. The process of claim 14 where said sacrificial coating is developable in weak base solution.

11. The process of claim 1 where said sacrificial coating is developable in solvent solution.

12. The process of claim 1 where said sacrificial coating is strippable in base solution.

13. The process of claim 1 where said sacrificial coating is strippable in solvent solution.

14. The process of claim 1 where said electroless plating catalyst is a colloidal metal catalyst.

15. The process of claim 14 where said colloidal metal catalyst is a palladium catalyst.

16. The process of claim 1 where said second coating is a second permanent dielectric.

17. The process of claim 1 where said second coating is a second sacrificial coating.

18. The process of claim 17 where said second sacrificial coating is replaced with a permanent dielectric.

19. The process of claims 1 or 16 where said permanent dielectric coating has a dielectric constant that does not exceed 4.5.

20. The process of claim 19 where said dielectric constant does not exceed 3.5.

21. The process of claim 1 where said deposited metal is copper.

22. The process of claims 1 or 16 where said permanent dielectric is selected from the group consisting of epoxies, polyamines, polyimides, cyanate esters, benzocyclobutene, acetylene terminated biphenols and liquid crystalline polymers, or mixtures thereof.

23. The process of claim 22 where said permanent dielectric contains a reinforcing agent.

24. The process of claim 23 where said reinforcing agent is selected from the group consisting of glass, quartz, polyaramid and polyamide.

25. The process of claim 1 where imaged openings in said dielectric coatings are formed by exposure of the same to actinic radiation followed by development in a liquid developer.

26. The process of claim 1 where imaged openings in said sacrificial coating are formed by exposure of the same to actinic radiation followed by development in a liquid developer.

27. The process of claim 1 where imaged openings in said second coating are formed by exposure of the same to actinic radiation followed by development in a liquid developer.

28. The process of claim 1 where imaged openings in said dielectric coatings are formed by laser ablation.

29. The process of claim 1 where imaged openings in said sacrificial coating are formed by laser ablation.

30. The process of claim 1 where imaged openings in said second coating are formed by laser ablation.

31. An article of manufacture formed by the process of claim 1.

* * * * *